United States Patent [19]

Kajimura et al.

[11] Patent Number: 4,740,976
[45] Date of Patent: Apr. 26, 1988

[54] SEMICONDUCTOR LASER DEVICE

[75] Inventors: Takashi Kajimura, Tokyo; Shinichi Nakatuka, Kokubunji; Naoki Chinone, Hachioji; Michiharu Nakamura; Yuichi Ono, both of Tokyo, all of Japan

[73] Assignee: Hitachi, Ltd, Japan

[21] Appl. No.: 592,956

[22] Filed: Mar. 23, 1984

[30] Foreign Application Priority Data

Mar. 24, 1983 [JP] Japan .................................. 58-47879
Jun. 8, 1983 [JP] Japan .................................. 58-100790

[51] Int. Cl.$^4$ ............................................. H01S 3/19
[52] U.S. Cl. ........................................ 372/45; 357/17; 372/46
[58] Field of Search ...................... 372/45, 46; 357/17

[56] References Cited

U.S. PATENT DOCUMENTS 4,480,331 10/1984 Thompson ............................. 372/46

OTHER PUBLICATIONS

J. J. Coleman et al., "High-Barrier Cluster-Free $Al_x$-$Ga_{1-x}As$-AlAs-GaAs Quantum-Well Heterostructure Laser", Appl. Phys. lett. 38(2), Jan. 15, 1981, pp. 63-65.

Primary Examiner—James W. Davie
Attorney, Agent, or Firm—Antonelli, Terry & Wands

[57] ABSTRACT

A semiconductor laser device comprises a semiconductor layer stack consisting of a first clad layer, an active layer, and a second clad layer which are successively stacked on a semiconductor substrate, and a light absorbing layer and a current blocking layer which are stacked on the second clad layer; the semiconductor assembly including a stripe shaped groove which extends from the surface of the semiconductor layer stack to the surface or interior of the second cladding layer, and another semiconductor layer having a forbidden band width greater than the active layer and the same conductivity type as the second clad layer which is embedded into the groove by chemical vapor deposition method.

13 Claims, 2 Drawing Sheets

SEMICONDUCTOR LASER DEVICE

BACKGROUND OF THE INVENTION

This invention relates to a fundamental transverse mode controlled semiconductor laser device and more particularly to a semiconductor laser device adapted to be fabricated by metal organic chemical vapor deposition (hereinafter referred to as MOCVD) method and a method of fabricating it.

A conventional typical transverse mode structure of the semiconductor laser made by MOCVD method was such as shown in FIG. 1, which is disclosed in J. J. Coleman et al, APL. 37 267 (1980). As seen from FIG. 1, a p type $Ga_{1-x}Al_xAs$ layer 6 is formed on a double hetero structure consisting of an n type GaAs substrate 1, n type $Ga_{1-x}Al_x$ As layer 2, and flat GaAs active layer 2 which are successively formed; and n type GaAs layer 4, which will act as an optical absorption and current blocking layer, is formed within the p type $Ga_{1-x}Al_xAs$ layer 6 while a stripe region 5 is left there; and a p side electrode 8 and n side electrode 9 are provided on the surface of a p type GaAs layer 7 formed on the p type $Ga_{1-x}Al_xAs$ layer 6 and the back surface of the n type GaAs substrate 1, respectively. The structure shown in FIG. 1 allows light generated in the GaAs active layer 3 to be absorbed in the n type GaAs layer 4 at the exterior of the stripe region 5, which gives rise to a difference of effective refractive index between the interior and exterior of the stripe region 5 thereby to perform transverse mode control.

SUMMARY OF THE INVENTION

An object of this invention is to provide a laser device having a controlled transverse oscillation mode and a low threshold current value and adapted to be fabricated by MOCVD method, and a method of fabricating it.

In order to attain the above object, in accordance with this invention there are provided a semiconductor laser device which possesses sufficient current blocking effect as well as transverse mode controlling effect and therefore is operated with a low threshold current value, and a method of fabricating it. The above sufficient current blocking effect and transverse mode controlling effect are achieved by independently providing a fourth semiconductor layer acting as a light absorbing layer and a fifth semiconductor layer acting as a current blocking layer in such a way that first to fifth semiconductor layers each having a predetermined forbidden band width and conductivity type are successively formed on a semiconductor substrate, a stripe shaped groove extending from the surface of the fifth embodiment layer to the surface or inside of the third semiconductor layer is formed by etching, and a sixth semiconductor layer is formed after the groove is embedded by chemical vapour deposition (CVD) method.

As described above, this invention enables the light absorbing layer and current blocking layer, which are independently provided on a clad layer 14, to effect enough current blocking action and enough transverse mode control action. Therefore, it is possible to obtain a semiconductor laser device the transverse mode of which is sufficiently controlled without the increase of threshold current value.

On one hand, the above light absorbing layer can be formed of a semiconductor layer having a forbidden band width smaller than that of an active layer. On the other hand, the current blocking layer can be formed of a semiconductor layer having a forbidden band width greater than that of the active layer, i.e. of a material transparent to a pertinent laser light. It is proper that the current blocking layer is provided in a semiconductor stack located on the active layer, and has a conductivity type which is so selected to generate a reverse bias in the stack consisting of this current blocking layer and upper and lower layers sandwiching it therebetween.

It is critical to independently or separately provide the light absorbing layer and the current blocking layer, but as a matter of course either one can be laminated on the active layer antecedently to the other. It might be preferable that the light absorbing layer is of opposite conductivity type to that of the current blocking layer.

With respect to a semiconductor laser of GaAs-GaAlAs system, the current blocking layer may be 0.5-1.0 $\mu$m when disposed outside the light absorbing layer and 0.2-0.5 $\mu$m thick, more preferably 0.2-0.3 $\mu$m thick, when disposed inside the light absorbing layer. This ensures a sufficient effect of the light absorbing layer. The light absorbing layer may be about 0.3-1.0 $\mu$m thick. The stripe of current channel may be 2-7 $\mu$m wide.

This invention provides a semiconductor laser device with a lower threshold current value ascribed to complete current blocking and fundamental transverse mode stabilizing effect which are achieved by independently providing a light absorbing layer and a current blocking layer. First to fifth semiconductor layers each having a predetermined forbidden band width and conductivity type are successively formed on a semiconductor substrate, a groove of stripe shape extending from the surface of the fifth semiconductor layer to the surface or inside of the third semiconductor layer is formed by etching, and a sixth semiconductor layer is formed by CVD while the groove is embedded.

In the semiconductor laser device having such a structure as explained referring to FIG. 1, the n type GaAs layer 4 does not effectively act as a current blocking layer since electron-hole pair generation occurs there due to light absorption, which leads to the increase of threshold current value. The structure according to this invention obviates such a problem.

The semiconductor layers in the structure according to this invention can be preferably grown by CVD method, more preferably by MOCVD which is more excellent in growth speed and productivity than the growth from liquid phase. In the semiconductor laser of GaAs-GaAlAs system, such as organic metal as trimethylgallium $Ga(CH_3)_3$, arsine $AsH_3$ is most commonly used for the GaAs layer while such an organic metal as trimethyl-aluminium $Al(CH_3)_3$ in addition to the above metals may also be employed for the GaAlAs layer. The active layer is kept flat by providing the light absorbing and current blocking layers above the active layer.

BRIEF DESCRIPTION OF THE DRAWINGS

The present invention will be apparent from the following detailed description taken in conjunction with the accompanying drawings, in which:

The embodiments according to this invention will be explained referring to the drawings. FIG. 2 is a cross sectional view showing a structure of one embodiment of a semiconductor laser according to this invention. On an n type GaAs substrate 11 (impurity concentration $n \approx 1 \times 10^{18} cm^{-3}$), are successively formed the following semiconductor layers by well known liquid phase growth or MOCVD: an n type $Ga_{1-x}Al_xAs$ clad layer 12 which is a first semiconductor layer (x=0.45, n=5 to $7 \times 10^{17} cm^{-3}$, 1 μm thick) having a forbidden band width greater than and the same conductivity type as that of the substrate 11; a $Ga_{1-y}Al_yAs$ active layer 13 (y=0.14, $p \approx 5 \times 10^{17} cm^{-3}$, 0.06–0.08 μm thick) which s a second semiconductor layer having a forbidden band width smaller than the first semiconductor layer; a p type $Ga_{1-z}Al_zAs$ clad layer 14 (=0.3–0.44, p=3 to $5 \times 10^{17} cm^{-3}$, 0.4–0.6 μm thick) which is a third semiconductor layer having a forbidden band width greater than the second semiconductor layer and a conductivity type opposite to the substrate; a $Ga_{1-u}Al_uAs$ light absorbing layer (u=0–0.1, $n \approx 1 \times 10^{18} cm^{-3}$, 0.3 μm thick) which is a fourth semiconductor layer having a forbidden band width smaller than the second semiconductor layer; and n type $Ga_{1-v}Al_vAs$ current blocking layer 16 (v=0.45, $n \approx 1 \times 10^{18} cm^{-3}$, 0.5–1 μm thick) which is a fifth semiconductor layer having a forbidden band width greater than the second semiconductor layer and the same conductivity type as the substrate; and a GaAs layer (0.5 μm thick). In the case of MOCVD, the GaAlAs layers are grown using trimethyl-gallium, arsine and trimethylaluminium. Incidentally, the final GaAs layer is used for preventing generation of aluminium oxide and not shown in FIG. 2 since it will be removed at the subsequent step. The active layer and the light absorbing layer maybe non-doped as well as lightly-doped in either type.

Figure 1:
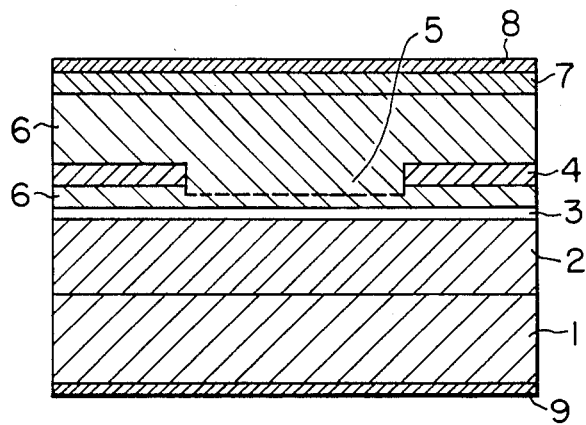
FIG. 1 is a cross section of a conventional semiconductor laser fabricated by MOCVD method.
Figure 2:
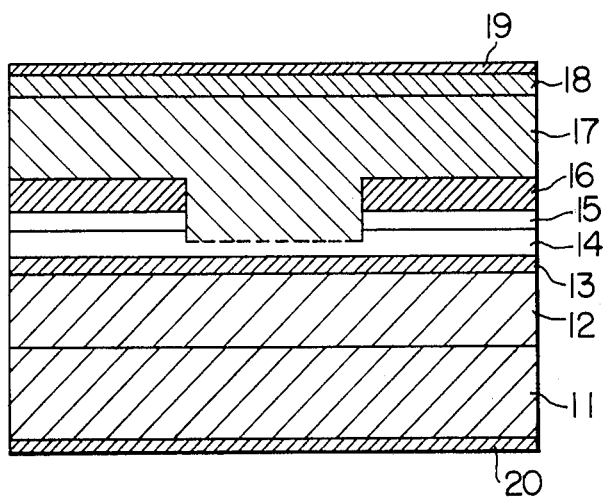
FIG. 2 is a cross section of one embodiment of a semiconductor laser according to this invention, taken along a face vertical to the propagation direction of laser light.

An $SiO_2$ film is formed on the surface of the GaAs layer and thereafter a stripe shaped window of 3–7 μm wide is formed in the $SiO_2$ film through a photo-resist step and etching step. Next, the crystal exposed at the window is etched away using an etching liquid of phosphoric acid group in such a way that the etching front proceeds to an intermediate position in the n type $Ga_{1-v}Al_vAs$ layer 16. The n type $Ga_{1-v}Al_vAs$ layer 16 at the window region is selectively etched away using an etching liquid of HF group and at the same time the $SiO_2$ film is removed. The $Ga_{1-u}Al_uAs$ light absorbing layer 15 exposed in a stripe shape and a part of the $Ga_{1-z}Al_zAs$ clad layer 14 therebeneath are etched together with the above uppermost GaAs layer. A p type $Ga_{1-w}Al_wAs$ layer (w=0.3–0.45) is filled in the etched groove by MOCVD method, a sixth semiconductor layer 16 of the p type $Ga_{1-w}Al_wAs$ is formed on the fifth semiconductor layer 16, and a p type GaAs layer 18 is formed thereon. Thereafter, a p side electrode (Cr-Au) 19 and an n side electrode (Au-Ge-Ni-Au) 20 are formed on the surface of the p type GaAs layer 18 and the back surface of the n type GaAs substrate 11, respectively. A semiconductor laser device having a resonator length of 300 μm was completed through a cleavage step.

The above semiconductor laser device carried out a continuous oscillation with an oscillation threshold current value of 30–40 mA at room temperature at an oscillation wavelength of 780 nm. It was confirmed that a laser transverse mode is a stable fundamental mode until light output reaches 30 mW. Moreover, the above semiconductor laser device was operated with a constant light output of 20 mW at the ambient temperature of 70° C. with the result that high reliability was confirmed without a significant deterioration at 3000 hours' operating time.

In case the current blocking layer is provided on the side of the active layer with respect to the light absorbing layer after the p type clad layer 14 is formed, there are successively formed an n type $Ga_{1-v}Al_vAs$ current blocking layer (v=0.45, 0.3 μm thick) which is a semiconductor layer having a forbidden band width greater than the second semiconductor layer, and a p type $Ga_{1-u}Al_uAs$ light absorbing layer (u=0–0.1, 0.5–1.0 μm thick) which is a semiconductor layer having a forbidden band width smaller than the second semiconductor layer and the same conductivity type as the substrate, and similar steps as employed in the above embodiment may follow.

In the above embodiment, a GaAs laser device was described but it is needless to say that the semiconductor laser according to this invention can be implemented using other material systems. Although a single semiconductor laser device was explained in the above embodiment, a laser array having plural elements arranged on a monolithic chip, or a phased-array providing a nonlinear interaction of light among adjacent plural elements can be accomplished using the laser structure according to this invention. Further, although the active layer was formed of a single layer in the above embodiment, the semiconductor laser device according to this invention can also be formed where the active layer is formed of a super lattice consisting of super thin films of two or more materials.

It should be noted that the clad layers sandwiching the active layer can be formed with different mixed crystal ratios by MOCVD method to realize an asymmetric refractive index profile. The embodiments thereof will be explained hereinbelow.

Figure 3:
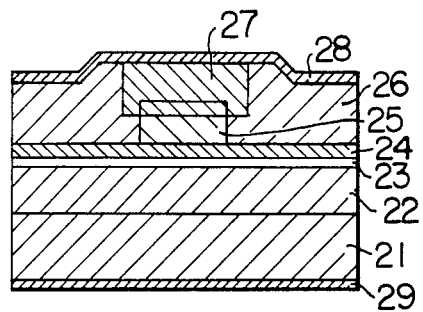
FIGS. 3 and 4 are cross sections of a semiconductor laser suitable to be fabricated by MOCVD, taken along a face vertical to the propagation direction of laser light.

The first example thereof will be explained referring to FIG. 3. On an n type GaAs substrate crystal 21, there was successively formed an n type $Ga_{1-x}Al_xAs$ clad layer 22 (x=0.45), $Ga_{1-y}Al_yAs$ active layer 23 (y=0.14), a p type $Ga_{1-z}Al_zAs$ clad layer 24 (z=0.26) and a p type $Ga_{1-u}Al_uAs$ layer 25 (u=0.45) by MOCVD method. A stripe of photo-resist 2–15 μm wide is formed on the surface of the $Ga_{1-u}Al_uAs$ layer 25 by photo-resist step and thereafter the $Ga_{1-u}Al_uAs$ layer 25 other than the stripe region is selectively etched by an etching liquid of HF group. After the photoresist is removed, an n type $Ga_{1-v}Al_vAs$ layer 26 (v=0–0.1) is grown by MOCVD method. After a striped shaped window 5–7 μm wide in an $SiO_2$ film is formed on the surface of the $Ga_{1-v}Al_vAs$ layer through $SiO_2$ film forming step and photoresist step, Zn is selectively diffused to form a diffused region 27. Thereafter p side electrode 28 and n side electrode 29 are formed. Then, a laser device of a resonator length of about 300 μm was completed through a cleavage step.

This laser device carried out a continuous oscillation with an oscillation threshold current value of 30–40 mA at room temperature at an oscillation wavelength of 780 nm. It was confirmed that the laser device oscillates with a stable fundamental transverse mode until light output reaches 30 mW. Moreover, the device was operated with a constant light output of 10 mW at the ambient temperature of 70° C. with the result that high reliability was confirmed without a significant deterioration at 2000 hours' operating time.

Figure 4:
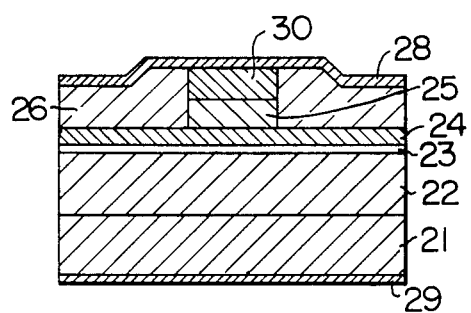

Another example will be explained referring to FIG. 4. On an n type GaAs substrate 21, there are successively formed an n type $Ga_{1-x}Al_xAs$ clad layer 22 (x=0.45), a $Ga_{1-y}Al_yAs$ active layer 23 (y=0.14), a p type $Ga_{1-z}Al_zAs$ clad layer 24 (z=0.26), a p type $Ga_{1-u}Al_uAs$ layer 25 (u=0.45) and a p type GaAs layer 30 by MOCVD method. After a stripe 2-15 μm wide consisting of an insulating film and a photo resist layer is formed on the p type GaAs layer 30 through an insulating film forming step and a photoresist step, the p type GaAs layer 30 other than the stripe region is etched by an etching liquid of phosphoric acid group in such a way that the etching depth advances on the way of the p type $Ga_{1-u}Al_uAs$ layer 25. Thereafter, the p type $Ga_{1-u}Al_uAs$ layer 35 other than the stripe region is selectively etched away using an etching liquid of HF group. After the photoresist is removed, an n type $Ga_{1-v}Al_vAs$ layer 26 (v=0-0.1) is grown by MOCVD method. After the insulating layer is removed, a p side electrode 28 and n side electrode 29 are formed. A laser device having a resonator length of 300 μm was completed through a cleavage step.

It was confirmed that this laser device gives substantially the same property as that in the first example mentioned above.

Although a single GaAlAs layer was employed as an active layer in the examples mentioned above, the active layer of a MQW (Multi Quantum Well) structure formed of a super lattice consisting of GaAs and AlAs or of a GRIN (Graded Refractive Index) structure could be produced with similar result. It is needless to say that the laser device according to the examples mentioned above is adaptable to the other material systems such as InGaAsP.

The above semiconductor laser is constructed in such a way that on a semiconductor substrate are successively formed a first semiconductor layer having the same conductivity type as and a forbidden band width greater than the semiconductor substrate, a second semiconductor layer having a forbidden band width smaller than the first semiconductor layer, and a third semiconductor layer having a conductivity type opposite to that of the substrate, a forbidden band width greater than the second semiconductor layer, and a thickness of 0.030-1 μm; at least a fourth semiconductor layer having a forbidden band width greater than and the same conductivity type as the third semiconductor layer is formed on the resultant surface of the stacked semiconductor layers in a stripe shape; and the surface of the third semiconductor layer other than the stripe region and at least the side surface of the fourth semiconductor layer are embedded with a semiconductor layer having a forbidden band width smaller than the second semiconductor layer.

Furthermore, in the semiconductor laser of GaAs-GaAlAs system, it is preferable that the substrate is GaAs, the semiconductor layer formed thereon has GaAlAs as a main component, the composition of AlAs in the third semiconductor layer is less than 0.3 and the composition of AlAs in the fourth semiconductor layer is more than 0.35.

We claim:

1. A semiconductor laser comprising:
   a semiconductor substrate;
   a first semiconductor layer formed on the substrate and having the same conductivity type as and a forbidden band width greater than the semiconductor substrate;
   a second semiconductor layer, formed on the first semiconductor layer, and having a forbidden band width smaller than the first semiconductor layer, said second semiconductor layer constituting an active layer of the laser;
   a third semiconductor layer, formed on the second semiconductor layer, having a conductivity type opposite to that of the substrate, a forbidden band width greater than the second semiconductor layer, and a thickness of 0.03-0.1μm;
   a fourth semiconductor layer, in the shape of a stripe, formed on a central portion of the third semiconductor layer, and having a forbidden band width greater than and the same conductivity type as the third semiconductor layer;
   a fifth semiconductor layer formed on the third semiconductor layer adjacent to the fourth semiconductor layer and, together with the third semiconductor layer, surrounding the fourth semiconductor layer, and having a forbidden band width smaller than that of the second semiconductor layer; and
   a pair of electrodes for allowing a current to flow therethrough, the pair of electrodes respectively being in electrical connection with the substrate and with the fourth semiconductor layer.

2. A semiconductor laser according to claim 1, further comprising a sixth semiconductor layer formed on the fourth semiconductor layer, the sixth semiconductor layer having a forbidden band width smaller than that of the second semiconductor layer and being of the same conductivity type as the fourth semiconductor layer, with the electrode which is in electrical connection with the fourth semiconductor layer being electrically connected to the sixth semiconductor layer.

3. A semiconductor laser according to claim 2, wherein the semiconductor laser is of a GaAs-GaAlAs system, the substrate of GaAs, the first, second, third and fourth semiconductor layers formed on the semiconductor substrate include GaAlAs as a main component, the composition of AlAs in the third semiconductor layer is less than 0.3 and the composition of AlAs in the fourth semiconductor layer is more than 0.35.

4. A semiconductor laser device according to claim 1, wherein at least part of said semiconductor regions are formed by metal organic chemical vapor deposition.

5. A semiconductor laser device according to claim 1, wherein said second semiconductor region is formed of a super-lattice structure.

6. A semiconductor laser according to claim 2, wherein the first and third semiconductor layers are clad layers for said active layer of the laser.

7. A semiconductor laser device according to claim 1, wherein said third semiconductor region has a refractive index higher than that of said first semiconductor region.

8. A semiconductor laser device according to claim 1, wherein the respective semiconductor layers are made of materials of GaAs-GaAlAs alloy system including GaAs.

9. A semiconductor laser according to claim 1, wherein the semiconductor laser is of a GaAs-GaAlAs system, the substrate is GaAs, the first, second, third and fourth semiconductor layers formed on the semiconductor substrate include GaAlAs as a main component, the composition of AlAs in the third semiconductor layer is less than 0.3 and the composition of AlAs in the fourth semiconductor layer is more than 0.35.

10. A semiconductor laser according to claim 1, wherein the first and third semiconductor layers are clad layers for said active layer of the laser.

11. A semiconductor laser device comprising:
a semiconductor substrate;
a first semiconductor region formed on said substrate and having a forbidden band width wider than that of said substrate and being of the same conductivity type as that of said substrate;
a second semiconductor region formed on said first semiconductor region and having a forbidden band width narrower than that of said first semiconductor region, said second semiconductor region constituting an active layer of the laser device;
a third semiconductor region formed on said second semiconductor region and having a forbidden band width wider than that of said second semiconductor region and having conductivity type opposite to that of said substrate;
at least three semiconductor regions formed on said third semiconductor region and forming a stripe structure, with the full thicknesses of at least two regions of said at least three semiconductor regions being used to from said stripe structure; and
a pair of electrodes for allowing a current to flow therethrough, with one of said pair of electrodes being formed on the substrate and the other of the pair of electrodes being formed on at least one of said at least three semiconductor regions;
wherein said at least three semiconductor regions include a fourth semiconductor region disposed on said third semiconductor region and having a stripe shape, said fourth semiconductor region having the same conductivity type as that of said third semiconductor region, a fifth semiconductor region disposed on said third semiconductor region at both sides of said fourth semiconductor region and having a forbidden band width narrower than that of said second semiconductor region, and a sixth semiconductor region disposed on said fourth semiconductor region in a stripe shape and arranged to be contacted with the other electrode, said fifth semiconductor region covering a side surface of said fourth and sixth semiconductor regions.

12. A semiconductor laser comprising:
a semiconductor substrate;
a first semiconductor layer formed on the substrate and having the same conductivity type as the semiconductor substrate;
a second semiconductor layer, formed on the first semiconductor layer, and having a forbidden band width smaller than the first semiconductor layer, said second semiconductor layer constituting an active layer of the laser;
a third semiconductor layer, formed on the second semiconductor layer, having a conductivity type opposite to that of the substrate, and a forbidden band width greater than that of the second semiconductor layer;
a fourth semiconductor layer, in the shape of a stripe, formed on the third semiconductor layer, having a forbidden band width greater than that of the second semiconductor layer, and being of the same conductivity type as the third semiconductor layer;
a fifth semiconductor layer formed on the third semiconductor layer adjacent to the fourth semiconductor layer and, together with the third semiconductor layer, surrounding the fourth semiconductor layer, and having a forbidden band width smaller than that of the second semiconductor layer; and
a pair of electrodes for allowing a current to flow therethrough, the pair of electrodes respectively being in electrical connection with the substrate and with the fourth semiconductor layer.

13. A semiconductor layer device comprising:
a semiconductor substrate;
a first semiconductor region formed on said substrate and being of the same conductivity type as that of said substrate;
a second semiconductor region formed on said first semiconductor region and having a forbidden band width narrower than that of said first semiconductor region, said second semiconductor region constituting an active layer of the laser device;
a third semiconductor region formed on said second semiconductor region, having a forbidden band width wider than that of said second semiconductor region, and having conductivity type opposite to that of said substrate;
at least three semiconductor regions formed on said third semiconductor region and forming a stripe structure, with the full thicknesses of at least two regions of said at least three semiconductor regions being used to form said stripe structure; and
a pair of electrodes for allowing a current to flow therethrough, with one of said pair of electrodes being formed on the substrate and the other of the pair of electrodes being formed on at least one of said at least three semiconductor regions;
wherein said at least three semiconductor regions include a fourth semiconductor region disposed on said third semiconductor region and having a stripe shape, said fourth semiconductor region having the same conductivity type as that of said third semiconductor region, a fifth semiconductor region disposed on said third semiconductor region at both sides of said fourth semiconductor region and having a forbidden band width narrower than that of said second semiconductor region, and a sixth semiconductor region disposed on said fourth semiconductor region in a stripe shape and arranged to be contacted with the other electrode, covering a side surface of said fourth and sixth semiconductor regions.

* * * * *